United States Patent
Liu et al.

(10) Patent No.: US 11,867,765 B2
(45) Date of Patent: Jan. 9, 2024

(54) BATTERY MICRO-SHORT CIRCUIT DETECTION METHOD AND APPARATUS

(71) Applicant: HUAWEI TECHNOLOGIES CO., LTD., Guangdong (CN)

(72) Inventors: Bingxiao Liu, Shanghai (CN); Rui Yang, Shanghai (CN); Xiaokang Liu, Shanghai (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 690 days.

(21) Appl. No.: 16/447,600

(22) Filed: Jun. 20, 2019

(65) Prior Publication Data

US 2019/0305384 A1 Oct. 3, 2019

Related U.S. Application Data

(63) Continuation of application No. PCT/CN2017/117965, filed on Dec. 22, 2017.

(30) Foreign Application Priority Data

Dec. 23, 2016 (CN) .......................... 201611206987.8

(51) Int. Cl.
*G01R 31/36* (2020.01)
*G01R 31/367* (2019.01)
(Continued)

(52) U.S. Cl.
CPC .......... *G01R 31/367* (2019.01); *G01R 31/36* (2013.01); *G01R 31/3644* (2013.01);
(Continued)

(58) Field of Classification Search
CPC .. G01R 31/367; G01R 31/36; G01R 31/3644; G01R 31/3842; G01R 31/396;
(Continued)

(56) References Cited

U.S. PATENT DOCUMENTS

| | | |
|---|---|---|
| 6,255,803 B1 | 7/2001 | Ishihara et al. |
| 2002/0109506 A1 | 8/2002 | Kawakami et al. |

(Continued)

FOREIGN PATENT DOCUMENTS

| | | |
|---|---|---|
| CN | 1821801 A | 8/2006 |
| CN | 101034141 A | 9/2007 |

(Continued)

*Primary Examiner* — Catherine T. Rastovski
*Assistant Examiner* — Lal C Mang
(74) *Attorney, Agent, or Firm* — WOMBLE BOND DICKINSON (US) LLP

(57) ABSTRACT

A battery micro-short circuit detection method and apparatus are disclosed. The method includes: obtaining a target initial battery parameter value of a target battery at an initial moment, and determining a reference initial battery parameter value of a virtual reference battery at the initial moment, where a response of the virtual reference battery is the same as a response of the target battery when a same excitation condition is given; obtaining a target battery parameter value of the target battery at a specified moment; determining a reference battery parameter value of the virtual reference battery at the specified moment based on the target battery parameter value and the reference initial battery parameter; and calculating a difference between the target battery parameter value and the reference battery parameter value, and determining, based on the difference, that the target battery is micro-short-circuited.

20 Claims, 4 Drawing Sheets

(51) Int. Cl.
   *G01R 31/396*   (2019.01)
   *G01R 31/3842*   (2019.01)
   *H01M 10/48*   (2006.01)
   *G01R 31/52*   (2020.01)

(52) U.S. Cl.
   CPC ....... *G01R 31/3842* (2019.01); *G01R 31/396* (2019.01); *G01R 31/52* (2020.01); *H01M 10/48* (2013.01)

(58) Field of Classification Search
   CPC ...... G01R 31/52; G01R 31/382; G01R 31/50; H01M 10/48; Y02E 60/10
   See application file for complete search history.

(56) References Cited

U.S. PATENT DOCUMENTS

| | | | |
|---|---|---|---|
| 2006/0186859 A1 | 8/2006 | Fujikawa et al. | |
| 2011/0148426 A1 | 6/2011 | Yokotani | |
| 2012/0169288 A1* | 7/2012 | Ueki | H02J 7/00 320/134 |
| 2012/0176140 A1 | 7/2012 | Kitsuani et al. | |
| 2012/0262126 A1* | 10/2012 | Boehm | H02J 7/00 320/162 |
| 2014/0120389 A1 | 5/2014 | Fink | |
| 2014/0376137 A1* | 12/2014 | Wang | B60R 16/033 361/86 |
| 2015/0377948 A1* | 12/2015 | Zhang | G01R 31/025 |
| 2016/0061907 A1* | 3/2016 | Koba | G01R 31/3662 |
| 2016/0190833 A1* | 6/2016 | Roumi | H02J 7/0021 |
| 2017/0242077 A1* | 8/2017 | Guo | B60L 58/12 |

FOREIGN PATENT DOCUMENTS

| | | | | |
|---|---|---|---|---|
| CN | 102104180 A | 6/2011 | | |
| CN | 102576895 A | 7/2012 | | |
| CN | 103636030 A | 3/2014 | | |
| CN | 104035048 A | 9/2014 | | |
| CN | 104614630 A | 5/2015 | | |
| CN | 104614631 A | 5/2015 | | |
| CN | 104833919 A | 8/2015 | | |
| EP | 1158306 A2 | 11/2001 | | |
| EP | 1158306 B1 * | 2/2008 | ............ | G01R 31/36 |
| EP | 2343558 A2 | 7/2011 | | |

* cited by examiner

BATTERY MICRO-SHORT CIRCUIT DETECTION METHOD AND APPARATUS

CROSS-REFERENCE TO RELATED APPLICATIONS

This application is a continuation of International Application No. PCT/CN2017/117965, filed on Dec. 22, 2017, which claims priority to Chinese Patent Application 201611206987.8, filed on Dec. 23, 2016. The disclosures of the aforementioned applications are hereby incorporated by reference in their entireties.

TECHNICAL FIELD

Embodiments of the present invention relate to the battery management field, and in particular, to a battery micro-short circuit detection method and apparatus.

BACKGROUND

A secondary battery is also referred to as a rechargeable battery or a storage battery. During use of the secondary battery, a safety problem such as thermal runaway, overcharge, or over-discharge may occur due to impact of a factor such as a raw material of the battery or a manner of using the battery. Thermal runaway is an ultimate manifestation of a battery safety problem. One of main causes of thermal runaway is a battery micro-short circuit. Battery micro-short circuits mainly include a micro-short circuit caused by an external factor, a micro-short circuit caused by an internal structure change of a battery, and the like. The micro-short circuit caused by an internal structure change of a battery has a long evolution process. A phenomenon of the battery micro-short circuit is insignificant at an early stage, and diagnosis of the battery micro-short circuit is easily confused with a problem such as battery bolt looseness, causing high difficulty in identifying the battery micro-short circuit. A micro-short circuit phenomenon of a single battery in a battery pack including a plurality of single batteries occurs occasionally, increasing difficulty in identifying a micro-short-circuited single battery from the battery pack. However, at a later stage, the battery micro-short circuit may cause a severe safety problem such as battery thermal runaway, and battery micro-short circuit detection is one of battery safety issues that urgently need to be resolved.

In the prior art, an equivalent internal resistance Zi of each single battery in a secondary battery pack is calculated by collecting a terminal voltage Ui of the single battery and an output current I of the single battery, and whether the single battery is micro-short-circuited is determined based on a difference ΔZi between Zi and a reference resistance. The reference resistance is an average value of equivalent internal resistances of all single batteries in the battery pack. If a relatively large quantity of single batteries are connected in series in a battery pack, a calculation amount for calculating an equivalent internal resistance of each single battery in real time by using a micro-short circuit detection manner in the prior art is large, and this imposes a high hardware requirement on a Battery Management System (BMS), and is difficult to implement. In addition, with aging of the battery pack, inconsistency between the single batteries in the battery pack increases. When a battery micro-short circuit is determined based on a value ΔZi, battery inconsistency is easy to be determined as a micro-short circuit, and an internal resistance change caused by a fault of a contact resistor or the like is easy to be erroneously reported as a micro-short circuit. Consequently, an erroneous determining probability is high, and applicability is poor.

SUMMARY

Embodiments of the present invention provide a battery micro-short circuit detection method and apparatus, to improve accuracy of battery micro-short circuit detection, enhance applicability of battery micro-short circuit detection, and reduce a probability of erroneous battery fault determining.

A first aspect provides a battery micro-short circuit detection method, and the method may include:
  obtaining a target initial battery parameter value of a target battery at an initial moment, and determining a reference initial battery parameter value of a virtual reference battery at the initial moment, where a response of the virtual reference battery is the same as a response of the target battery when a same excitation condition is given;
  obtaining a target battery parameter value of the target battery at a specified moment;
  determining a reference battery parameter value of the virtual reference battery at the specified moment based on the target battery parameter value and the reference initial battery parameter; and
  calculating a difference between the target battery parameter value and the reference battery parameter value, and determining, based on the difference, that the target battery is micro-short-circuited.

In one embodiment of the present invention, the virtual reference battery is used to simulate an operating status of the target battery, and the response of the virtual reference battery is the same as the response of the target battery when the same excitation condition is given. Therefore, whether the target battery is micro-short-circuited may be determined based on the difference that is between the battery parameter values of the virtual reference battery and the target battery and that is obtained through comparison in an operating process of the target battery, and the operation is simple. Even a minor sign of an internal short circuit of a battery may be found through detection based on a difference between parameter values that is obtained through comparison. Therefore, monitoring on a micro-short circuit status of a battery may start with monitoring on a minor short circuit. This improves the accuracy of detecting on an internal short circuit of a battery, and reduces a probability of erroneous battery fault determining. Monitoring may start from an early stage of a battery short circuit, so as to better prevent dangers, such as battery thermal runaway, caused by a micro-short circuit of a single battery.

In one embodiment, the target battery parameter value includes a target terminal voltage value of the target battery, a current value of the target battery, and a temperature parameter value of the target battery; and the initial battery parameter value of the virtual reference battery includes an initial state-of-charge value of the virtual reference battery;
  duration between the specified moment and the initial moment is $\Delta T0$;
  the determining a reference battery parameter value of the virtual reference battery at the specified moment based on the target battery parameter value and the reference initial battery parameter includes:
  determining a state-of-charge change value of the virtual reference battery within $\Delta T0$ based on the current value of the target battery and the temperature parameter value of the target battery, and determining a reference remaining battery capacity of the virtual reference battery based on the initial state-of-charge value of the virtual reference battery; and the calculating a difference between the target battery parameter value and the reference battery parameter value, and determining, based on the difference, that the target battery is micro-short-circuited includes:

calculating a target remaining battery capacity of the target battery based on the target terminal voltage value, and calculating a battery capacity difference between the target remaining battery capacity and the reference remaining battery capacity; and determining, based on the battery capacity difference, that the target battery is micro-short-circuited.

In one embodiment of the present invention, a difference between remaining battery capacities of the virtual reference battery and the target battery under a same temperature excitation condition may be determined based on battery parameter values, such as the terminal voltage value and the current value, of the battery. It is determined, based on the difference between the remaining battery capacities, that the battery is micro-short-circuited. Whether the target battery is faulty, for example, is micro-short-circuited, is determined by comparing the remaining battery capacities of the batteries. Therefore, the operation is simple, and applicability is high.

In one embodiment, the specified moment includes a first moment and a second moment, and duration between the second moment and the first moment is $\Delta T1$;

the battery capacity difference includes a first battery capacity difference corresponding to the first moment, and a second battery capacity difference corresponding to the second moment; and the determining, based on the battery capacity difference, that the target battery is micro-short-circuited includes:

calculating a target difference between the second battery capacity difference and the first battery capacity difference, and determining a ratio of the target difference to $\Delta T1$ as a leakage current value of the target battery; and if the leakage current value is greater than or equal to a preset current threshold, determining that the target battery is micro-short-circuited.

In one embodiment of the present invention, a difference between remaining battery capacities of the virtual reference battery and the target battery may be detected at any two moments in a battery operation process, and the leakage current value of the target battery is calculated based on a difference between two remaining battery capacity differences corresponding to the two moments. A micro-short circuit status of the target battery is more intuitively and clearly determined by using the leakage current value. Therefore, determining is more accurate, and applicability is higher.

In one embodiment, the specified moment includes a first moment and a second moment, and duration between the second moment and the first moment is $\Delta T1$;

the battery capacity difference includes a first battery capacity difference corresponding to the first moment, and a second battery capacity difference corresponding to the second moment; and the determining, based on the battery capacity difference, that the target battery is micro-short-circuited includes:

calculating a target difference between the second battery capacity difference and the first battery capacity difference, and determining a ratio of the target difference to $\Delta T1$ as a leakage current value of the target battery;

calculating an average voltage value of the target battery within the duration, and determining a micro-short circuit resistance of the target battery with reference to the leakage current value; and if a value of the micro-short circuit resistance is less than a preset resistance threshold, determining that the target battery is micro-short-circuited.

In one embodiment of the present invention, after the leakage current value of the target battery is obtained, the micro-short circuit resistance of the target battery may be further calculated. A micro-short circuit status of the target battery is more intuitively and clearly determined by using the micro-short circuit resistance. This increases diversity of battery micro-short circuit detection manners, and has high flexibility. A value of the micro-short circuit resistance of the target battery may also be quantitatively detected through calculation of the micro-short circuit resistance. Therefore, determining is more accurate, a probability of erroneous battery fault determining is reduced, and applicability is higher.

In one embodiment, the target battery parameter value includes a target terminal voltage value of the target battery, a current value of the target battery, and a temperature parameter value of the target battery;

the initial battery parameter value of the virtual reference battery includes an initial state-of-charge value of the virtual reference battery;

duration between the specified moment and the initial moment is $\Delta T0$;

the determining a reference battery parameter value of the virtual reference battery at the specified moment based on the target battery parameter value and the reference initial battery parameter includes:

determining a state-of-charge change value of the virtual reference battery within $\Delta T0$ based on the current value of the target battery and the temperature parameter value of the target battery, and determining a reference remaining battery capacity of the virtual reference battery based on the initial state-of-charge value of the virtual reference battery; and determining a reference terminal voltage value of the virtual reference battery at the specified moment based on the reference remaining battery capacity and the current value; and the calculating a difference between the target battery parameter value and the reference battery parameter value, and determining, based on the difference, that the target battery is micro-short-circuited includes:

calculating a voltage difference between the target terminal voltage value and the reference terminal voltage value, and determining, based on the voltage difference, that the target battery is micro-short-circuited.

In one embodiment of the present invention, the terminal voltage value of the virtual reference battery under a same temperature excitation condition may be determined based on battery parameter values, such as the terminal voltage value and the current value, of the target battery. It is determined, based on the difference between the terminal voltages of the virtual reference battery and the target battery, that the target battery is micro-short-circuited. Therefore, terminal voltage detection is simple and is less difficult to implement, thereby improving applicability of battery micro-short circuit detection.

In one embodiment, the determining, based on the voltage difference, that the target battery is micro-short-circuited includes:

if the voltage difference is greater than a preset voltage threshold, determining that the target battery is micro-short-circuited.

In one embodiment of the present invention, in a scenario in which the difference between the terminal voltages of the virtual reference battery and the target battery is greater than the preset voltage threshold, it may be determined that the target battery is micro-short-circuited. It is determined, based on a result of comparison between the terminal voltage difference and the preset voltage threshold, that the target battery is micro-short-circuited. This improves flexibility of battery micro-short circuit detection, and applicability is higher.

In one embodiment, the determining, based on the voltage difference, that the target battery is micro-short-circuited includes:
  calculating a battery capacity difference between remaining battery capacities of the virtual reference battery and the target battery based on the voltage difference and the current value of the target battery; and
  if the battery capacity difference is greater than a preset battery capacity threshold, determining that the target battery is micro-short-circuited.

In one embodiment of the present invention, the battery capacity difference between the virtual reference battery and the target battery may be determined based on the difference between the terminal voltages of the virtual reference battery and the target battery. The battery capacity difference is determined based on the voltage difference, and it is further determined, based on the battery capacity difference, that the target battery is micro-short-circuited. Therefore, diversity of battery micro-short circuit detection manners is increased, flexibility of battery micro-short circuit detection is improved, and applicability is higher.

In one embodiment, the determining a reference terminal voltage value of the virtual reference battery at the specified moment based on the reference remaining battery capacity and the current value includes:
  determining an element parameter of the virtual reference battery based on the reference remaining battery capacity, where the virtual reference battery includes an equivalent circuit, and the element parameter is a parameter value of an element in the equivalent circuit in a case of the temperature parameter value; and
  determining a terminal voltage value of the element based on the current value and the element parameter, and determining the reference terminal voltage value of the virtual reference battery based on the terminal voltage value of the element.

In one embodiment of the present invention, impact of an environmental factor, such as temperature, on the element parameter of the equivalent circuit included in the virtual reference battery may be considered for determining the terminal voltage value of the virtual reference battery. This further improves accuracy of simulating the target battery by using the virtual reference battery, and improves accuracy of micro-short circuit detection for the target battery.

In one embodiment, the virtual reference battery is a battery model that is created based on an electrochemical parameter or a physical parameter of the target battery through mathematical equivalence, electrochemical modeling, or the like. The battery model includes an equivalent circuit model or an electrochemical model.

In one embodiment of the present invention, a virtual battery model may be created in a plurality of manners. The virtual reference battery is obtained through modeling. The virtual reference battery is used to simulate the target battery, to determine whether the target battery operates normally. Therefore, the operation is flexible, and applicability is high.

A second aspect provides a battery micro-short circuit detection apparatus, and the apparatus may include:
  an obtaining module, configured to: obtain a target initial battery parameter value of a target battery at an initial moment, and determine a reference initial battery parameter value of a virtual reference battery at the initial moment, where a response of the virtual reference battery is the same as a response of the target battery when a same excitation condition is given, where
  the obtaining module is further configured to obtain a target battery parameter value of the target battery at a specified moment;
  a determining module, configured to determine a reference battery parameter value of the virtual reference battery at the specified moment based on the target battery parameter value obtained by the obtaining module and the reference initial battery parameter; and
  a calculation module, configured to calculate a difference between the target battery parameter value obtained by the obtaining module and the reference battery parameter value determined by the determining module, where
  the determining module is further configured to determine, based on the difference obtained by the calculation module through calculation, that the target battery is micro-short-circuited.

In one embodiment, the target battery parameter value includes a target terminal voltage value of the target battery, a current value of the target battery, and a temperature parameter value of the target battery; and the initial battery parameter value of the virtual reference battery includes an initial state-of-charge value of the virtual reference battery;
  duration between the specified moment and the initial moment is $\Delta T0$;
  the determining module is configured to:
  determine a state-of-charge change value of the virtual reference battery within $\Delta T0$ based on the current value of the target battery and the temperature parameter value of the target battery, and determine a reference remaining battery capacity of the virtual reference battery based on the initial state-of-charge value of the virtual reference battery;
  the calculation module is configured to:
  calculate a target remaining battery capacity of the target battery based on the target terminal voltage value, and calculate a battery capacity difference between the target remaining battery capacity and the reference remaining battery capacity; and
  the determining module is configured to determine, based on the battery capacity difference obtained by the calculation module through calculation, that the target battery is micro-short-circuited.

In one embodiment, the specified moment includes a first moment and a second moment, and duration between the second moment and the first moment is $\Delta T1$;
  the battery capacity difference includes a first battery capacity difference corresponding to the first moment, and a second battery capacity difference corresponding to the second moment; and
  the determining module is configured to:
  calculate a target difference between the second battery capacity difference and the first battery capacity difference, and determine a ratio of the target difference to $\Delta T1$ as a leakage current value of the target battery; and if the leakage current value is greater than or equal to a preset current threshold, determine that the target battery is micro-short-circuited.

In one embodiment, the specified moment includes a first moment and a second moment, and duration between the second moment and the first moment is $\Delta T1$;

the battery capacity difference includes a first battery capacity difference corresponding to the first moment, and a second battery capacity difference corresponding to the second moment;

the calculation module is configured to:

calculate a target difference between the second battery capacity difference and the first battery capacity difference, and determine a ratio of the target difference to $\Delta T1$ as a leakage current value of the target battery; and calculate an average voltage value of the target battery within the duration, and determine a micro-short circuit resistance of the target battery with reference to the leakage current value; and the determining module is configured to:

if a value of the micro-short circuit resistance obtained by the calculation module through calculation is less than a preset resistance threshold, determine that the target battery is micro-short-circuited.

In one embodiment, the target battery parameter value includes a target terminal voltage value of the target battery, a current value of the target battery, and a temperature parameter value of the target battery;

the initial battery parameter value of the virtual reference battery includes an initial state-of-charge value of the virtual reference battery;

duration between the specified moment and the initial moment is $\Delta T0$;

the determining module is configured to:

determine a state-of-charge change value of the virtual reference battery within $\Delta T0$ based on the current value of the target battery and the temperature parameter value of the target battery, and determine a reference remaining battery capacity of the virtual reference battery based on the initial state-of-charge value of the virtual reference battery; and determine a reference terminal voltage value of the virtual reference battery at the specified moment based on the reference remaining battery capacity and the current value;

the calculation module is configured to:

calculate a voltage difference between the target terminal voltage value and the reference terminal voltage value; and the determining module is further configured to determine, based on the voltage difference obtained by the calculation module through calculation, that the target battery is micro-short-circuited.

In one embodiment, the determining module is configured to:

when the voltage difference obtained by the calculation module through calculation is greater than a preset voltage threshold, determine that the target battery is micro-short-circuited.

In one embodiment, the determining module is configured to:

calculate a battery capacity difference between remaining battery capacities of the virtual reference battery and the target battery based on the voltage difference and the current value of the target battery; and if the battery capacity difference is greater than a preset battery capacity threshold, determine that the target battery is micro-short-circuited.

In one embodiment, the determining module is configured to:

determine an element parameter of the virtual reference battery based on the reference remaining battery capacity, where the virtual reference battery includes an equivalent circuit, and the element parameter is a parameter value of an element in the equivalent circuit in a case of the temperature parameter value; and determine a terminal voltage value of the element based on the current value and the element parameter, and determine the reference terminal voltage value of the virtual reference battery based on the terminal voltage value of the element.

In one embodiment, the virtual reference battery is a battery model that is created based on an electrochemical parameter or a physical parameter of the target battery through mathematical equivalence, electrochemical modeling, or the like. The battery model includes an equivalent circuit module or an electrochemical model.

According to a third aspect, an embodiment of the present invention provides a terminal device, including a memory and a processor, where the memory is configured to store a group of program code; and the processor is configured to invoke the program code stored in the memory, to perform the method provided in the first aspect.

In the embodiments of the present invention, the battery model, such as the equivalent circuit model and the electrochemical model, may be used as the virtual reference battery. The virtual reference battery is used to simulate the operating status of the target battery, and whether the target battery is micro-short-circuited may be further determined based on the difference between the battery parameter values of the virtual reference battery and the target battery. In the embodiments of the present invention, battery parameter values, such as the terminal voltage value and the operating current value, of the target battery may be collected. Further, battery parameters, such as the remaining battery capacity of the target battery, and the terminal voltage and the remaining battery capacity of the virtual reference battery, may be calculated. Further, it may be determined, based on the difference between the terminal voltages or the remaining battery capacities of the virtual reference battery and the target battery, that the target battery is micro-short-circuited. In this way, an amount of data that needs to be stored and a data calculation amount are relatively small, difficulty of battery micro-short circuit detection is reduced, and applicability is high. Moreover, in the embodiments of the present invention, the micro-short circuit resistance value of the target battery may be estimated based on the leakage current value of the target battery, and a micro-short circuit status of the target battery may be detected before the target battery is subject to a severe micro-short circuit. A minor micro-short circuit may be found in advance through detection, and a quantitative result is provided. This can improve accuracy of micro-short circuit detection and reduce a probability of erroneous battery fault determining, so as to achieve a prevention objective and improve battery safety.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

A battery micro-short circuit detection method provided in the embodiments of the present invention may be applied to a terminal device. Specifically, the terminal device may be built in an existing BMS, or may be a device including an existing BMS. This may be specifically determined depending on a requirement in an actual application scenario, and is not limited herein. The terminal device may also be referred to as user equipment (UE), a mobile station (MS), a mobile terminal, or the like. The terminal device may also be a portable, pocket-sized, handheld, computer built-in, in-vehicle mobile apparatus, or the like. For example, the terminal device may be a mobile phone (or referred to as a "cellular" phone), a computer or an electric automobile that has mobility. It should be understood that in addition to the terminal device, the battery micro-short circuit detection method provided in the embodiments of the present invention may be applied to another apparatus using a secondary battery. This is not limited herein. A to-be-detected target battery described in the embodiments of the present invention may be a single battery in a series battery pack, or may be a single battery that operates independently. This may be specifically determined depending on an actual application scenario, and is not limited herein.

Figure 1:
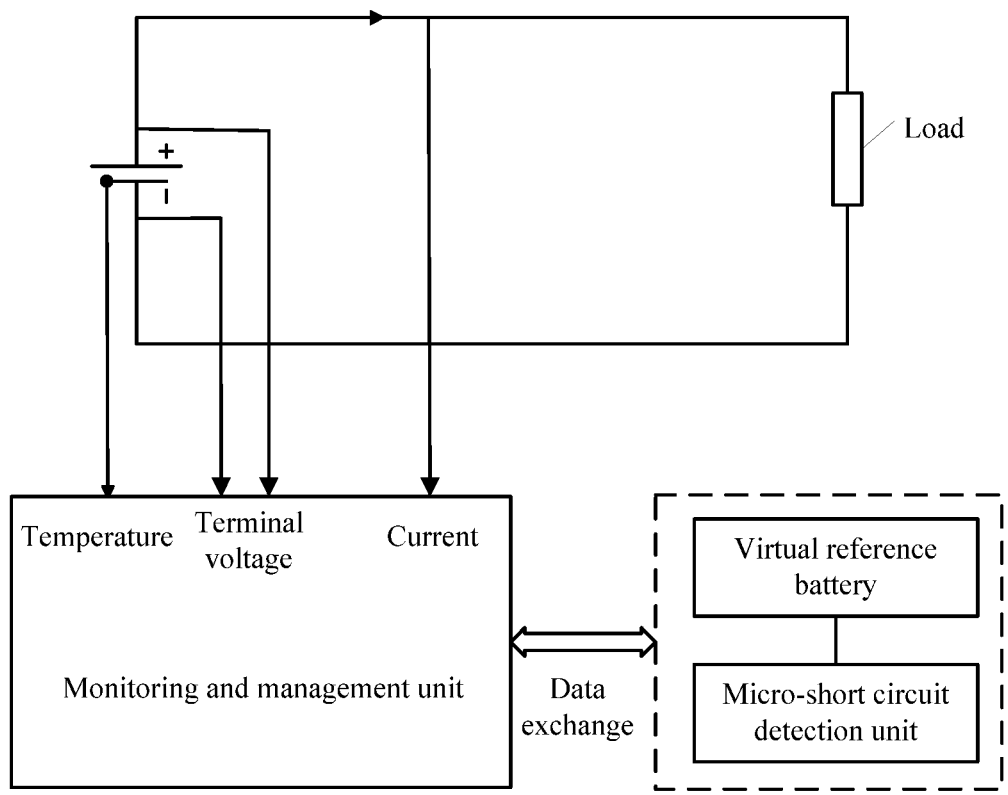
FIG. 1 is a schematic structural diagram of a battery micro-short circuit detection system according to an embodiment of the present invention.

FIG. 1 is a schematic structural diagram of a battery micro-short circuit detection system according to an embodiment of the present invention. The battery micro-short circuit detection system provided in this embodiment of the present invention may be a battery micro-short circuit detection system included in the foregoing terminal device, or may be a battery micro-short circuit detection system built in an existing BMS. This may be specifically determined depending on an actual application scenario, and is not limited herein. The battery micro-short circuit detection system provided in this embodiment of the present invention includes a target battery, a monitoring and management unit of the target battery, a virtual reference battery, a micro-short circuit detection unit, and the like. The target battery may be specifically a battery on which micro-short circuit detection needs to be performed. The monitoring and management unit of the target battery may be specifically the existing BMS or a related monitoring and management unit included in the BMS. This may be specifically determined depending on an actual application scenario, and is not limited herein.

The monitoring and management unit may be configured to record operating status data of the target battery. The operating status data includes a battery parameter, such as a terminal voltage value, an operating current value, or a temperature parameter value, of the target battery at each charge/discharge moment. The micro-short circuit detection unit is configured to: determine, based on a difference between battery parameter values of the virtual reference battery and the target battery, whether the target battery is micro-short-circuited; calculate a short circuit resistance value existing when the target battery is micro-short-circuited; and so on. The micro-short circuit detection unit is further configured to calculate a terminal voltage value, a remaining battery capacity value, and a post-aging battery component parameter value, and the like of the virtual reference battery. This may be specifically determined depending on an actual application scenario, and is not limited herein.

In a charge/discharge process of the target battery, the BMS may record in real time battery parameters, such as the terminal voltage value, the operating current value, and the temperature value, of the target battery; and use the operating current value and the temperature value of the target battery as input of the virtual reference battery. Under excitation of battery parameters such as an input current and a given temperature, the virtual reference battery generates a reference terminal voltage value related to the battery parameters such as the current value and the temperature value that are input. The micro-short circuit detection unit may compare an actual terminal voltage (which may be set as a target terminal voltage) of the target battery with the reference terminal voltage of the virtual reference battery, to obtain a voltage difference; and may further determine, based on the voltage difference, whether the target battery is micro-short-circuited. Further, in this embodiment of the present invention, a difference between a remaining battery capacity of the target battery and the remaining battery capacity of the virtual reference battery may be determined based on a parameter, such as the terminal voltage value, of the target battery, and whether the target battery is micro-short-circuited is determined based on the difference between the remaining battery capacities.

The virtual reference battery may be a battery model that is created based on an electrochemical parameter or a physical parameter of the target battery through mathematical equivalence, electrochemical modeling, or the like. The virtual reference battery is an equivalent battery model of the target battery. To be specific, a response (namely, output) of the virtual reference battery is the same as a response of the target battery when a same excitation condition (namely, input) is given. The excitation condition may include an operating current, a temperature, pressure, and the like.

Figure 2:
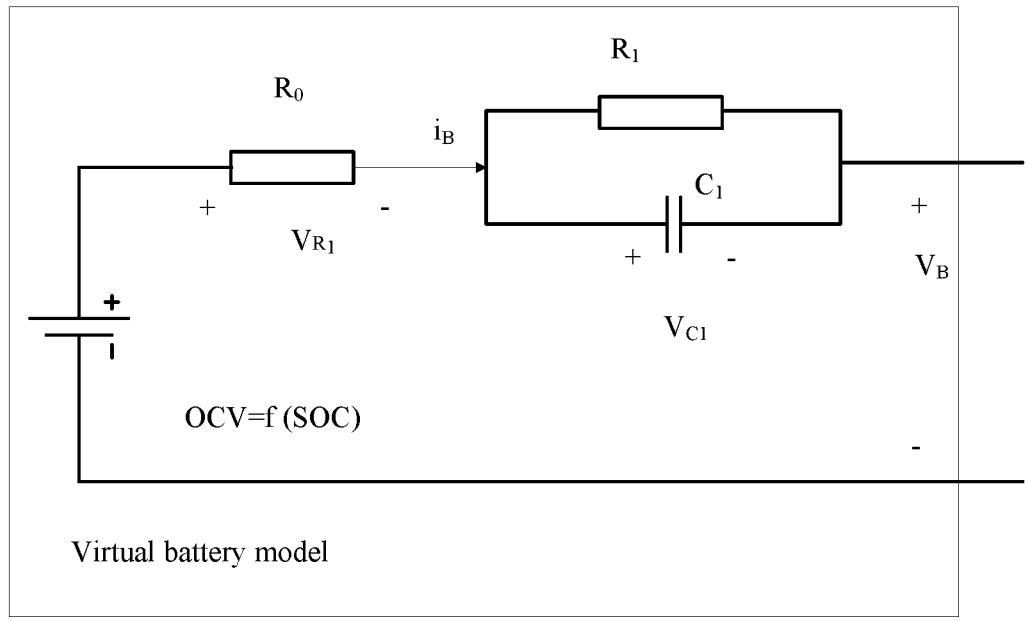
FIG. 2 is a schematic model diagram of a virtual reference battery according to an embodiment of the present invention.

FIG. 2 is a schematic model diagram of a virtual reference battery according to an embodiment of the present invention. The virtual reference battery may be implemented by a virtual battery model of a first-order Thevenin's equivalent circuit, and includes elements such as resistors $R_0$ and $R_1$, and a capacitor $C_1$. The virtual battery model may modify a state of charge (SOC) of the virtual battery model by using an ampere-hour integration method. An RC terminal voltage of the equivalent circuit is obtained through current integration.

In one embodiment, the virtual reference battery needs to be initialized at an early stage of a lifecycle of the virtual reference battery, to ensure accuracy of simulating the target battery by using the virtual reference battery, so that the virtual reference battery can reflect a status of the target battery in real time. During initialization of the virtual reference battery (it is assumed that the initialization is performed at a moment t0), an open circuit voltage (which is set to OCV(t0)) and SOC(t0) of the target battery at this moment, resistances $R_0(t0)$ and $R_1(t0)$ and a capacitance $C_1(t0)$ that are in the corresponding first-order Thevenin's circuit, and terminal voltages $V_{C1}(t0)$ at two ends of the capacitor $C_1$ may be calculated based on a terminal voltage (which is set to $V_{B\_real}$), an operating current (which is set to $i_B$), and a temperature (which is set to $Temp_B$) of the target battery at the moment t0. In addition, OCV(t0), SOC(t0), $i_B$, $Temp_B$, $R_0(t0)$, $R_1(t0)$, $C_1(t0)$, and $V_{C1}(t0)$ are used as initialization parameters of the virtual battery model shown in FIG. 2.

It should be noted that after the initialization of the virtual reference battery is completed, battery parameter values, such as a terminal voltage, an operating current, a temperature, and an SOC, of the virtual reference battery are consistent with battery parameter values of the target battery at this time. The "being consistent" means being the same or approximately the same. The "being approximately the same" means that a difference between the battery parameter value of the virtual reference battery and the battery parameter value of the target battery falls within a preset difference range, or that impact of the difference on management of the target battery can be ignored, where the difference range is a permissible error range.

Once the initialization of the virtual battery model is completed, only parameter values, such as the operating current and the temperature, of the target battery may need to be received. Further, parameter values, such as a remaining battery capacity and the terminal voltage, of the virtual reference battery may be obtained. If the target battery is not short-circuited, at any charge/discharge moment, battery parameter values, such as the remaining battery capacity and the terminal voltage, of the virtual reference battery are consistent (the "being consistent" herein is not being completely the same in mathematics, but means that numerical values are close, a difference falls within an engineering permissible range, and so on) with battery parameter values, such as a remaining battery capacity and the terminal voltage, of the target battery. If the target battery is short-circuited, even if all battery parameter values of the virtual reference battery are consistent with those of the target battery at the initialization moment, a change trend of a battery parameter value, such as a remaining battery capacity, of the target battery may be different from a change trend of a battery parameter, such as the remaining battery capacity, of the virtual reference battery due to an internal short circuit of the battery. A specific reflection may include the following: A short-circuit resistance accelerates reduction of the remaining battery capacity of the target battery. As a result, a difference between the remaining battery capacity of the virtual reference battery and the remaining battery capacity of the target battery gradually increases, and a difference between terminal voltage values of the virtual reference battery and the target battery also gradually increases accordingly. Therefore, in this embodiment of the present invention, whether the target battery is micro-short-circuited may be determined by identifying a change trend of the difference between the remaining battery capacity of the virtual reference battery and the remaining battery capacity of the target battery, or a change trend of a difference between battery parameters, such as a change trend of the difference between the terminal voltage of the virtual reference battery and the terminal voltage of the target battery.

In one embodiment, the virtual reference battery may alternatively be implemented by an electrochemical model. The electrochemical model may be specifically a P2D model or another model in existing documentation. This is not limited herein. The embodiments of the present invention are described by using the P2D model as an example. The model is merely an example, and is intended to explain the embodiments of the present invention and constitutes no limitation on the embodiments of the present invention.

A battery micro-short circuit detection method and apparatus provided in the embodiments of the present invention are described below with reference to FIG. 3 to FIG. 5 by using the virtual battery model of the equivalent circuit shown in FIG. 2 as an example.

Figure 3:
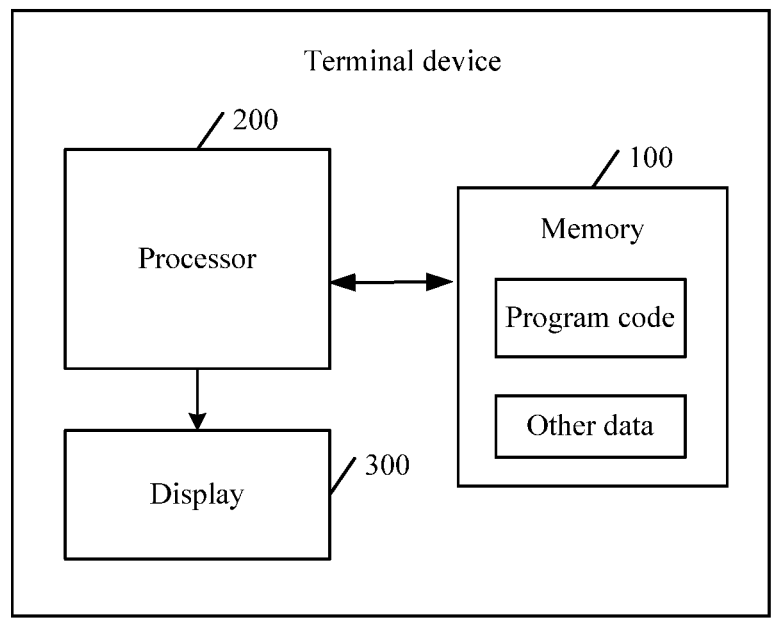
FIG. 3 is a schematic structural diagram of a micro-short circuit detection unit according to an embodiment of the present invention.

FIG. 3 is a schematic structural diagram of a micro-short circuit detection unit according to an embodiment of the present invention. As shown in FIG. 3, the micro-short circuit detection unit provided in this embodiment of the present invention may include a memory 100, a processor 200, a display 300, and the like. The memory 100 stores a group of program code. The program code is used to implement the following operations: identifying a charge/discharge status of a virtual reference battery, detecting a value of a charge/discharge current, detecting a value of a terminal voltage, estimating a state of charge, recording a charge time, calculating a micro-short circuit resistance of a target battery, and so on. The processor 200 is configured to read the program code in the memory 100, and then perform a method defined by the program code. For example, the processor 200 may read the program code stored in the memory 100, to perform an operation such as battery micro-short circuit detection.

The processor 200 may include one or more processors. For example, the processor 200 may include one or more central processing units. When the processor 200 includes a plurality of processors, the plurality of processors may be integrated in one chip, or each may be an independent chip. One processor may include one or more processing cores. The following embodiments are described by using an example in which one processor includes a plurality of cores. However, the battery micro-short circuit detection method provided in the embodiments of the present invention may also be applied to a single-core processor. This may be specifically determined depending on a requirement in an actual application scenario, and is not limited herein.

In addition, the memory 100 further stores other data different from the program code. The other data may include data generated after the processor executes the program code, such as a terminal voltage value in a charge process of the virtual reference battery. The memory 100 usually includes a memory and an external memory. The memory may be a random access memory (RAM), a read-only memory (ROM), a cache, and the like. The external memory may be a hard disk, an optical disc, a USB flash drive, a floppy disk, a tape drive, or the like. The program code is usually stored in the external memory. Before performing processing, the processor loads the program code from the external memory to the memory.

Figure 4:
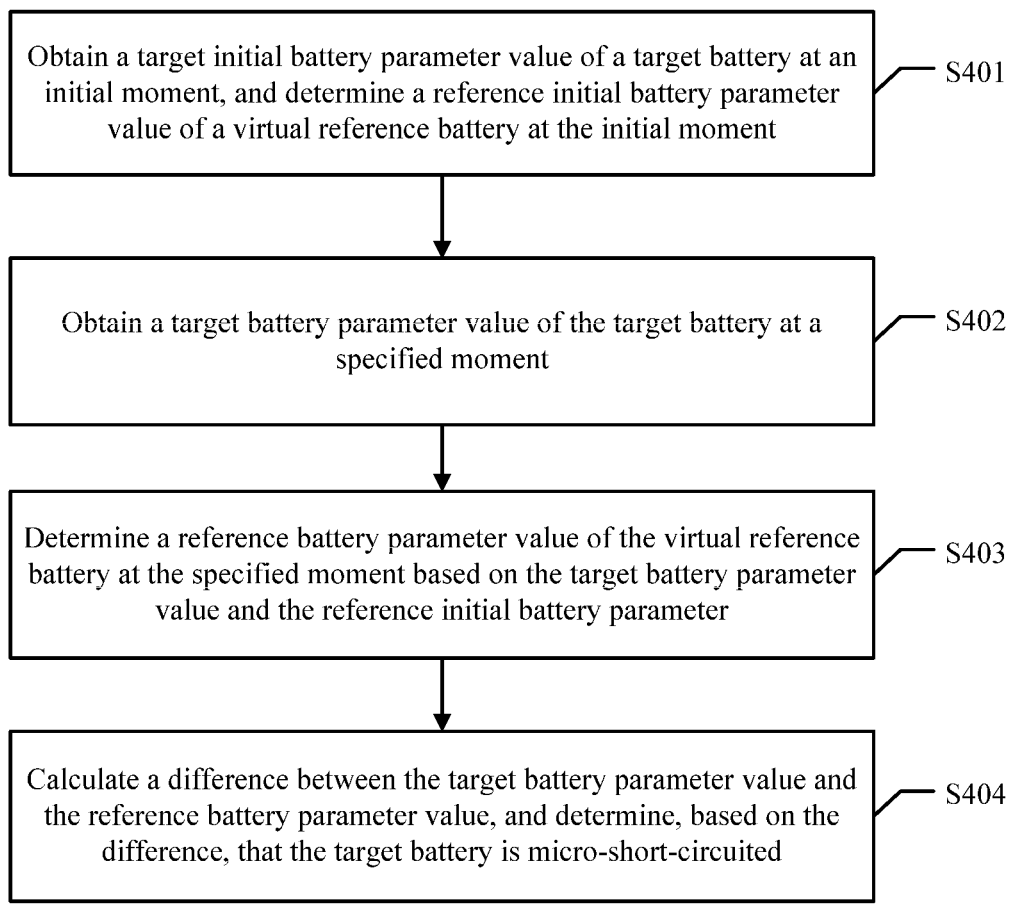
FIG. 4 is a schematic flowchart of a battery micro-short circuit detection method according to an embodiment of the present invention.

FIG. 4 is a schematic flowchart of a battery micro-short circuit detection method according to an embodiment of the present invention. The method provided in this embodiment of the present invention includes the following operations.

Operation S401: Obtain a target initial battery parameter value of a target battery at an initial moment, and determine a reference initial battery parameter value of a virtual reference battery at the initial moment.

In one embodiment, a micro-short circuit detection unit (a terminal device is used as an execution body for describing this embodiment of the present invention, and is briefly referred to as a terminal below) may collect, by using an existing BMS, charge/discharge data of the target battery when a battery system operates normally, and may further determine, based on the charge/discharge data collected by the BMS, a battery parameter value of the target battery at any moment.

In one embodiment, when detecting a status of the target battery (that is, whether the target battery is micro-short-circuited), the terminal may obtain the battery parameter value (namely, the target initial battery parameter value) of the target battery at the initial moment from the charge/discharge data collected by the BMS. The terminal may alternatively directly detect the battery parameter value of the target battery at the initial moment. This may be specifically determined depending on an actual application scenario, and is not limited herein. Further, the terminal may determine a battery parameter value (namely, the reference initial battery parameter value) of the virtual reference battery at the initial moment based on the target initial battery parameter value of the target battery. The initial moment may be an initialization moment of the virtual reference battery, or may be any moment after the virtual reference battery is initialized, and at this moment, the reference initial battery parameter value of the virtual reference battery is the same as the target initial battery parameter value of the target battery. The battery parameter values of the virtual reference battery and the target battery are the same at the initial moment. Therefore, at any moment after the initial moment, if there is a difference between the battery parameter values of the virtual reference battery and the target battery, whether the target battery is micro-short-circuited may be determined based on the difference.

Further, in one embodiment, the initial moment may alternatively be any moment after the virtual reference battery is initialized, and at this moment, there is a difference between the reference initial battery parameter value of the virtual reference battery and the target initial battery parameter value of the target battery. In this case, both the reference initial battery parameter value and the target initial battery parameter value may be obtained through calculation by using a battery parameter value of the target battery existing when the virtual reference battery is initialized. In addition, at any moment after the initial moment, whether the target battery is micro-short-circuited may be determined based on a change trend of the difference between the battery parameter values of the virtual reference battery and the target battery.

In one embodiment, the target initial battery parameter value may include an initial SOC, a terminal voltage value, a temperature parameter value, an operating current value, and the like of the target battery. The reference initial battery parameter value may include an initial SOC, a terminal voltage value, and a temperature parameter value of the virtual reference battery, a parameter value of an element in an equivalent circuit, and the like. This may be specifically determined depending on a requirement in an actual application scenario, and is not limited herein.

Operation S402: Obtain a target battery parameter value of the target battery at a specified moment.

In one embodiment, in a charge/discharge working process of the target battery, the terminal may obtain a battery parameter value (namely, the target battery parameter value) of the target battery at a moment (namely, the specified moment) after the initial moment. Specifically, the terminal may obtain the target battery parameter value from the data recorded in the BMS, or may obtain the target battery parameter value through detection. This embodiment of the present invention is described by using an example in which the target battery parameter value is obtained from the data recorded in the BMS. This is not repeated below. The target battery parameter value may include a terminal voltage value (namely, a target terminal voltage value) of the target battery, an operating current value of the target battery, a temperature parameter value (or briefly referred to as a temperature value) of the target battery, and the like. For example, when determining, based on a difference between remaining battery capacities of the virtual reference battery and the target battery, whether the target battery is micro-short-circuited, the terminal may obtain a battery parameter, such as a terminal voltage value, of the target battery at a moment, and may further determine the difference between the remaining battery capacities of the virtual reference battery and the target battery with reference to the battery parameter value at the initial moment.

In one embodiment, in a charge/discharge working process of the target battery, the terminal may obtain battery parameter values (namely, a first target battery parameter value and a second target battery parameter value) of the target battery at any two moments (that is, the specified moment includes a first specified moment and a second specified moment) after the initial moment. The first target battery parameter value or the second target battery parameter value may also include a terminal voltage value (namely, a target terminal voltage value) of the target battery, an operating current value of the target battery, a temperature parameter value (or briefly referred to as a temperature value) of the target battery, and the like. For example, if the terminal determines, based on a leakage current value or a micro-short circuit resistance value of the target battery, whether the target battery is micro-short-circuited, the terminal may calculate the leakage current value or the micro-short circuit resistance value by obtaining two groups of battery parameter values at the first specified moment and the second specified moment. If the terminal determines, based on a change trend of a difference between remaining battery capacities of the virtual reference battery and the target battery, whether the target battery is micro-short-circuited, the terminal may obtain battery parameters, such as terminal voltage values, of the target battery at any two moments (for example, the first specified moment and the second specified moment); and may further determine the change trend of the difference based on a difference between remaining battery capacities of the virtual reference battery and the target battery at each moment, and determine, based on the change trend of the difference, whether the target battery is micro-short-circuited.

Operation S403: Determine a reference battery parameter value of the virtual reference battery at the specified moment based on the target battery parameter value and the reference initial battery parameter.

Operation S404: Calculate a difference between the target battery parameter value and the reference battery parameter value, and determine, based on the difference, that the target battery is micro-short-circuited.

In one embodiment, after obtaining the target battery parameter value of the target battery at the specified moment, the terminal may determine a corresponding battery parameter value (namely, the reference battery parameter value) of the virtual reference battery at the specified moment based on the target battery parameter value and the reference initial battery parameter of the virtual reference battery. Further, the terminal may determine, based on the difference between the reference battery parameter value and the target battery parameter value, whether the target battery is micro-short-circuited.

In one embodiment, if the battery parameter values of the target battery and the virtual reference battery are the same at the initial moment, in other words, the target initial battery parameter value and the reference initial battery parameter value are the same, the terminal may determine, based on a difference between the battery parameter values of the target battery and the virtual reference battery at the specified moment, whether the target battery is micro-short-circuited. In specific implementation, the terminal may record the terminal voltage value (namely, the target terminal voltage value, denoted by $V_{B\_real}$), the operating current value (denoted by $i_B$), and the temperature parameter value (denoted by $T_B$) of the target battery at a time interval of duration Ts. Duration between the specified moment and the initial moment may be set to $\Delta T0$, and $\Delta T0$ may be one or more Ts. This embodiment of the present invention is described by using an example of one Ts.

In one embodiment, the terminal may determine a state-of-charge change value of the virtual reference battery within $\Delta T0$ based on the current value of the target battery and the temperature parameter value of the target battery, and may further determine a remaining battery capacity (namely, a reference remaining battery capacity) of the virtual reference battery based on an initial state-of-charge value of the virtual reference battery. Assuming that $\Delta T0$ is equal to Ts, the virtual remaining battery capacity is denoted by $SOC_{virtual}(t_0+T_s)$, and the initial state-of-charge value of the virtual reference battery is denoted by $SOC_{virtual}(t_0)$, the following equation is obtained:

$$SOC_{virtual}(t_0 + T_s) = SOC_{virtual}(t_0) - \frac{\eta}{C_B} \times \int_{t_0}^{T_s} i_B dt$$

where t0 is the initial moment, $\eta$ is charge/discharge efficiency of the target battery (and the virtual reference battery), and $C_B$ is a capacity (namely, a full-charge voltage value) of the target battery (and the virtual reference battery) at a current temperature.

In one embodiment, after obtaining the remaining battery capacity (namely, the reference remaining battery capacity) of the virtual reference battery through calculation, the terminal may compare the remaining battery capacity of the virtual reference battery with a remaining battery capacity (namely, a target remaining battery capacity) of the target battery, and determine, based on a difference between the reference remaining battery capacity and the target remaining battery capacity, whether the target battery is micro-short-circuited. In specific implementation, the target remaining battery capacity may be obtained through calculation based on a terminal voltage and an operating current of the target battery that are obtained through detection at the specified moment, and the operation is simple. If a state of charge of the virtual reference battery is the same as that of the target battery at the initial moment, and remaining battery capacities of the virtual reference battery and the target battery are inconsistent at the specified moment, or a difference between remaining battery capacities of the virtual reference battery and the target battery falls out an error range at the initial moment, it may be determined that the target battery is micro-short-circuited. Alternatively, if there is a difference A between a state of charge of the virtual reference battery and that of the target battery at the initial moment, there is a difference B between remaining battery capacities of the virtual reference battery and the target battery at the specified moment, and the difference B is greater than the difference A or a difference between the difference B and the difference A falls out a preset error range, it may be determined that the target battery is micro-short-circuited.

In one embodiment, the terminal may further determine the leakage current value of the target battery based on a difference between remaining battery capacities of the target battery at any two moments after the initialization moment, and may further determine, based on the leakage current value, whether the target battery is micro-short-circuited. In specific implementation, it is assumed that two specified moments, after the initialization moment of the virtual reference battery, for recording a target battery parameter of the target battery are respectively a first moment and a second moment, and duration between the first moment and the second moment is $\Delta T1$. The terminal may calculate, based on the foregoing implementation, a difference (namely, a first battery capacity difference) between remaining battery capacities of the virtual reference battery and the target battery at the first moment, and a difference (namely, a second battery capacity difference) between remaining battery capacities of the virtual reference battery and the target battery at the second moment; and may further determine the leakage current value $I_{leak}$ of the target battery based on $\Delta T1$ and a difference (namely, a target difference) between the first battery capacity difference and the second battery capacity difference. For example, if the first moment is $T_c$, the second moment is $T_c+\Delta T1$, the first battery capacity difference is $\Delta C_{Tc}$, and the second battery capacity difference is $\Delta C_{Tc+\Delta T1}$; and the following equation is obtained:

$$I_{leak}=(\Delta C_{Tc+\Delta T1}-\Delta C_{Tc})/\Delta T1$$

It should be noted that a micro-short circuit described in this embodiment of the present invention may include a minor short circuit that occurs inside the target battery or between positive and negative terminals. In specific implementation, a definition of short circuit severity of the minor short circuit is related to a state of charge of a battery, a battery shape, or the like, and is also related to a detection requirement in an actual application scenario. This may be specifically determined depending on a requirement in an actual application scenario, and is not limited herein. Further, in this embodiment of the present invention, a short circuit status of the battery is determined based on a difference between remaining battery capacity differences between the virtual reference battery and the target battery. Even a minor sign of an internal short circuit of a battery may be found through detection based on a battery capacity difference between batteries. Therefore, monitoring on an internal short circuit status of a single battery may start with monitoring on a minor short circuit. This improves accuracy of detecting an internal short circuit of a battery, reduces a probability of erroneous battery fault determining, and prevents, as early as possible, dangers such as battery thermal runaway caused by an internal short circuit of a single battery. The terminal may more intuitively and clearly determine a micro-short circuit status of the target battery based on the leakage current value.

In one embodiment, the terminal may set, based on a battery feature parameter, such as battery performance stability or voltage detection precision, of a single battery in a battery pack, a preset current threshold for the leakage current value used to determine whether the target battery is micro-short-circuited. After obtaining the leakage current value of the target battery, the terminal may compare the leakage current value of the target battery with the preset current threshold. If the leakage current value of the target battery is greater than or equal to the preset current threshold, it may be determined that the target battery is micro-short-circuited. If the leakage current value of the target battery is less than the preset current threshold, it may be determined that the target battery is not micro-short-circuited. Specifically, the preset current threshold may be set based on a self-discharge current value of a battery in a normal operating state. The self-discharge current value of the battery is related to an inherent feature of the battery, and the preset current threshold may be greater than the self-discharge current value of the battery. In specific implementation, the preset current threshold is related to battery feature parameters such as battery performance stability and voltage detection precision. If battery performance stability is poor, and voltage detection precision is low, the preset current threshold may be set to a relatively large value, to prevent a factor, such as low voltage detection precision, from causing erroneous determining of a battery micro-short circuit. In addition, setting of the preset current threshold may be further related to a balance achieved by a developer between an erroneous determining probability of a detection algorithm used for battery micro-short circuit detection and a requirement for mainly identified micro-short circuit severity. If a low erroneous determining probability is required for the detection algorithm, the preset current threshold may be properly increased; or if identification of the micro-short circuit status of the target battery needs to start with a very minor micro-short circuit of the to-be-detected single battery, the threshold may be properly reduced. This may be specifically determined depending on an actual application scenario, and is not limited herein.

Further, in one embodiment, after obtaining the leakage current value of the target battery, the terminal may further perform modification if the leakage current value is negative, to improve precision of calculating the leakage current value. Specifically, if the leakage current value obtained through calculation is less than 0, duration of $\Delta T1$ may be increased, and the leakage current value of the target battery may be re-calculated. To be specific, the terminal may reselect two specified moments, so that duration between the two specified moments is relatively large, and then the terminal obtains the leakage current value of the target battery through re-calculation based on corresponding parameters, such as remaining battery capacities, of the virtual reference battery and the target battery at the two reselected specified moments. It should be noted that in this embodiment of the present invention, setting a comparison threshold for the leakage current value of the target battery to 0 may affect only precision of calculating the leakage current value, and does not affect a function of calculating the leakage current value. Therefore, another non-zero constant may also be selected as the comparison threshold for the leakage current value. This may be specifically determined depending on a requirement in an actual application scenario, and is not limited herein.

In one embodiment, after obtaining the leakage current value of the target battery through calculation, the terminal may further calculate an average voltage value of the target battery within the duration corresponding to $\Delta T1$, and calculate a micro-short circuit resistance of the target battery based on the leakage current value and the average voltage value. Assuming that the average voltage value of the target battery within $\Delta T1$ is $V_{avg}$, and the micro-short circuit resistance of the target battery is $R_{ISC}$, the following equation is obtained:

$$R_{ISC}=V_{avg}/I_{Leak}$$

In this embodiment of the present invention, the micro-short circuit status of the target battery is more intuitively and clearly determined by using the micro-short circuit resistance, and the micro-short circuit resistance value of the target battery and the like may also be quantitatively detected through calculation of the micro-short circuit resistance. After determining the leakage current value of the target battery, the terminal may calculate the micro-short circuit resistance of the target battery based on the average voltage value of the target battery. The leakage current value of the target battery includes a leakage current value obtained after modification. In specific implementation, the terminal may record, by using the BMS, a voltage value of the target battery at each voltage sampling moment within the duration between the second moment and the first moment. Specifically, in a charge/discharge process of the target battery, the BMS may collect voltage values of the target battery based on a preset voltage sampling period. The preset voltage sampling period may be an existing voltage collection period in the BMS. This is not limited herein. The terminal may obtain the voltage value of the target battery at each voltage sampling moment from voltage values of the target battery that are recorded in the BMS, and may further calculate the average voltage value of the target battery. If the target battery is in an online state within the duration between the second moment and the first moment, N voltage sampling moments included in the duration between the second moment and the first moment may be determined based on the preset voltage sampling period. A first voltage sampling moment in the N voltage sampling moments is a voltage sampling moment closest to the first moment, namely, a first collection moment, within the duration, at which the BMS collects the voltage value of the target battery based on the existing voltage collection period. Then the BMS may continuously collect voltage values of the target battery at other voltage sampling moments within the duration based on the voltage collection period. A last voltage sampling moment is a voltage sampling moment closest to the second moment. Duration between two adjacent voltage sampling moments in the N voltage sampling moments is equal to the voltage sampling period in the BMS, namely, the preset voltage sampling period.

It should be noted that if the target battery is faulty between the second moment and the first moment, for example, the target battery is powered off because an external power supply device of the target battery is faulty and stops supplying power to the target battery, the N voltage sampling moments are collection moments at which the BMS collects voltage values of the single battery when the target battery is in a normal operating state. The BMS does not collect voltage values of the target battery in a time period in which the target battery is in an interrupted operating state. For example, after the BMS collects voltage values of target battery at the voltage collection moment closest to the first moment, the target battery is faulty, and the BMS cannot collect or record the voltage value of the target battery. After the target battery resumes the normal operating state, the BMS may continue to collect and record the voltage value of the target battery. In this application scenario, a quantity of N voltage sampling moments (it is assumed that the quantity is N1) included between the second moment and the first moment is less than a quantity of N voltage sampling moments (it is assumed that the quantity is N2) included between the second moment and the first moment in the application scenario in which the target battery is always in the online state within the duration between the second moment and the first moment. In other words, N1 is less than N2.

In one embodiment, if the target battery is a single battery that operates independently, the terminal may calculate the average voltage value of the target battery within ΔT1 based on voltage values of the target battery at all voltage sampling moments. If the target battery is a single battery in a battery pack, the terminal may sequentially calculate a first average voltage value, which is set to U(kT), of single batteries in the battery pack that includes the target battery at a $K^{th}$ voltage sampling moment, and a second average voltage value, which is set to $U_M((k-1)T)$, of the single batteries in the battery pack at a $(K-1)^{th}$ voltage sampling moment, where the $K^{th}$ voltage sampling moment and the $(K-1)^{th}$ voltage sampling moment are included in every two adjacent voltage sampling moments in the N voltage sampling moments. For example, when K is equal to 2, the terminal may calculate an average value of voltage values of the single batteries in the battery pack at the first voltage sampling moment, and an average value of voltage values of the single batteries in the battery pack at a second voltage sampling moment. Further, the terminal scales the first average voltage value and the second average voltage value based on a preset filtering coefficient, and accumulates a scaled value of the first average voltage value and a scaled value of the second average voltage value, to obtain an average voltage value (set to $U_M(kT)$) at the $K^{th}$ voltage sampling moment. The terminal may calculate the average voltage value of the battery pack at the $K^{th}$ voltage sampling moment, as shown in the following expression:

$$U_M(kT) = \alpha \cdot U(E) + (1-\alpha) \cdot U_M((k-1)T)$$

where $U_M(kT)$ is an approximate average voltage value of the single batteries (including the target battery) in the battery pack at a current moment, $U_M((k-1)T)$ is an approximate average voltage value of the single batteries in the battery pack at a previous moment, U(kT) is an average voltage value of voltage values of the single batteries that are collected at the current moment, and α is a filtering coefficient, and may be set to 0.0001 herein.

When K is equal to 3, the terminal may calculate an average voltage value (which may be specifically the average voltage value of the single batteries in the battery pack at the previous moment) that is of voltage values of the single batteries in the battery pack and that is at a second voltage sampling moment, and an average voltage value (which may be specifically the average voltage value of the voltage values of the single batteries that are collected at the current moment) that is of voltage values of the single batteries in the battery pack and that is at a third voltage sampling moment. Further, when K is equal to 3, the average voltage value (namely, the approximate average voltage value of the single batteries in the battery pack at the current moment) of the single batteries in the battery pack may be calculated based on the foregoing expression of $U_M(kT)$. By analogy, an average voltage value at each voltage collection moment is sequentially calculated. When K is equal to N, the average voltage value at the $K^{th}$ voltage sampling moment may be determined as an average voltage value within the duration between the second moment and the first moment.

Descriptions are provided below by using an example in which the duration between the second moment and the first moment is $U_M$.

Further, it may be determined, with reference to the leakage current value of the target battery, that the micro-short circuit resistance of the target battery is $R_{ISC}$:

$$R_{ISC} = \begin{cases} \dfrac{U_M}{I_{ds,i}} & I_{ds,i} > 0 \\ \text{Inf} & I_{ds,i} = 0 \end{cases}$$

where $R_{ISC}$ is a micro-short circuit resistance of a single battery i (namely, the target battery), $I_{ds}$ is the leakage current value (namely, $I_{Leak}$) of the target battery, and Inf indicates that no short circuit occurs. The micro-short circuit status of the target battery may be quantitatively determined through calculation of the micro-short circuit resistance of the target battery. Therefore, determining is more accurate, and applicability is higher.

In one embodiment, after obtaining an SOC (for example, $SOC_{virtual}(t0+T_s)$) of the virtual reference battery at the specified moment, the terminal may determine the terminal voltage value (namely, a reference terminal voltage value) of the virtual reference battery based on the SOC of the virtual reference battery. Further, after determining the terminal voltage value of the virtual reference battery, the terminal may determine, based on a difference between terminal voltage values of the target battery and the virtual reference battery, whether the target battery is micro-short-circuited.

In one embodiment, when the equivalent circuit model shown in FIG. 2 is used for the virtual reference battery, reference battery parameters of the virtual reference battery usually include the following parameters:
  charge/discharge efficiency η of the virtual reference battery;
  a state of full charge $C_B$ of the virtual reference battery in a current state;
  a relational expression f1 between an SOC and an open circuit voltage (English: Open Circuit Voltage, OCV) of the virtual reference battery, where f1 usually is approximately a polynomial; and
  relational expressions g1, g2, and g3, where g1, g2, and g3 are relational expressions between an SOC, a temperature $T_B$, and R0, between the SOC, the temperature $T_B$, and R1, and between the SOC, the temperature $T_B$, and C1 respectively, and usually are approximately polynomials.

It should be noted that during long-term use, the target battery ages as a use time increases. In this case, to improve accuracy of simulating the target battery by using the virtual reference battery, when the battery parameters of the virtual reference battery are determined based on the battery parameters, such as the terminal voltage, the operating current, and the temperature, of the target battery, the battery parameters of the virtual reference battery, including parameters of elements in the equivalent circuit model, need to be updated. The battery parameters of the virtual reference battery may be updated in the following operations.

Operation 1: Obtain an aging parameter of the target battery.

Operation 2: Update the battery parameters of the virtual reference battery based on the aging parameter of the target battery.

The to-be-updated battery parameters of the virtual reference battery include the battery charge/discharge efficiency, the state of full charge, SOC-OCV relationships at different temperatures, the relational expressions between the SOC and $T_B$ and each R0, R1, and C1, and the like.

After the battery parameters of the virtual reference battery are updated, the remaining battery capacity and the terminal voltage value of the virtual reference battery continue to be updated based on the operating current of the target battery (which is equivalent to an operating current of the virtual reference battery). Specific operations are as follows.

Operation 1: Modulate the SOC of the virtual battery based on an integral value of the operating current of the virtual reference battery and a current capacity of the virtual battery:

$$SOC_{virtual}(t_0 + T_s) = SOC_{virtual}(t_0) - \frac{\eta}{C_B} \times \int_{t_0}^{T_s} i_B dt$$

where t0 is the initial moment, $\eta$ is charge/discharge efficiency of the target battery (and the virtual reference battery) at a current temperature, and $C_B$ is a capacity of the target battery (and the virtual reference battery) at the current temperature.

Operation 2: Update a corresponding OCV of the equivalent circuit of the virtual reference battery based on the SOC of the virtual reference battery:

$$OCV_{virtual}(t_0+T_s)=f1(SOC_{virtual}(t_0+T_s))$$

where OCVvirtual(t0+Ts) is an OCV of the equivalent circuit at a current moment (namely, a specified moment t0+Ts).

Operation 3: Update a resistance value and a capacitance value of the equivalent circuit based on an OCV of the virtual reference battery:

$$R_0(t_0+T_s)=g1(OCV_{virtual}(t_0+T_s))$$

$$R_1(t_0+T_s)=g2(OCV_{virtual}(t_0+T_s))$$

$$C_1(t_0+T_s)=g3(OCV_{virtual}(t_0+T_s))$$

where $R_0(t_0+T_s)$, $R_1(t_0+T_s)$, and $C_1(t_0+T_s)$ are resistance values and a capacitance value at the current moment.

Operation 4: Update terminal voltages between two ends of each of a resistor and a capacitor in the equivalent circuit:

$$V_{R0}(t_0 + T_s) = R_0(t_0 + T_s) \times i_B(t_0 + T_s)$$

$$V_{C1}(t_0 + T_s) = R_1(t_0 + T_s) \times i_B(t_0 + T_s) + e^{-\frac{T_s}{R_1 \times C_1}}(V_{C1}(t_0 + T_s) - R_1(t_0 + T_s) \times i_B(t_0 + T_s))$$

Operation 5: Update a terminal voltage of the virtual reference battery:

$$V_{B\_virtual0}(t_0+T_s)=OCV_{virtual}(t_0+T_s)-V_{R0}(t_0+T_s)-V_{C1}(t_0+T_s),$$

where $V_{B\_virtual0}$ is the terminal voltage $V_B$ (namely, the reference terminal voltage value) of the equivalent circuit shown in FIG. 2.

It should be noted that the foregoing calculation form is merely a form for updating a virtual battery model. In addition to the equivalent circuit model, an electrochemical model may also be used to update an aging status and the terminal voltage and capacity parameters of the virtual battery. Impact of battery aging on battery performance is usually counted in a unit of a month or a year. However, impact of an operating current of a battery on a remaining battery capacity and a terminal voltage of the battery is usually counted in a unit of a second or a minute. Therefore, in an actual application scenario, different calculation time intervals may be used for a parameter update caused by battery aging, and an update, caused by the operating current, of the remaining battery capacity and the terminal voltage. For example, a relatively short time interval may be selected as a calculation time interval for the update of the remaining battery capacity and the terminal voltage, and a relatively long time interval may be selected as an update time interval for the battery parameter update caused by aging. This may be specifically determined depending on an actual application scenario, and is not limited herein.

In one embodiment, after determining the terminal voltage of the virtual reference battery based on updated battery parameters of the virtual reference battery, the terminal may compare the terminal voltage of the virtual reference battery with the terminal voltage of the target battery, and determine, based on a difference between the terminal voltages, whether the target battery is micro-short-circuited. In specific implementation, the terminal may preset a preset voltage threshold used to determine whether the target battery is micro-short-circuited. If the voltage difference between the terminal voltages of the virtual reference battery and the target battery is greater than or equal to the preset voltage threshold, it may be determined that the target battery is micro-short-circuited. If the voltage difference between the terminal voltages of the virtual reference battery and the target battery is less than the preset voltage threshold, it may be determined that the target battery is not micro-short-circuited.

Further, in one embodiment, after determining the voltage difference between the terminal voltages of the virtual reference battery and the target battery, the terminal may also determine the battery capacity difference between the remaining battery capacities of the virtual reference battery and the target battery based on the voltage difference and the operating current value of the virtual reference battery. If the battery capacity difference is greater than a preset battery capacity threshold, it may be determined that the target battery is micro-short-circuited; or if the battery capacity difference is not greater than a preset battery capacity threshold, it may be determined that the target battery is not micro-short-circuited.

Further, in one embodiment, the virtual reference battery may be implemented by an electrochemical model such as P2D, and a leakage current value and an internal short circuit resistance value of the virtual reference battery of the electrochemical model may be further calculated. This embodiment of the present invention is described by using the P2D model as an example. In this model, battery parameters of the virtual reference battery may include model parameters such as a solid particle radius $R_s$, a solid-phase diffusion coefficient $D_s$, a liquid-phase diffusion coefficient $D_e$, an effective liquid-phase diffusion coefficient $D_e^{\it eff}$, a particle specific surface area $a_s$, a total battery surface area A, effective solid-phase ionic conductivity $\sigma^{\it eff}$, and effective liquid-phase ionic diffusion conductivity $\kappa^{\it eff}$. A liquid-phase volume fraction, a liquid-phase volume fraction of a negative electrode, a liquid-phase volume fraction of a positive electrode, and a liquid-phase volume fraction of a septate area are respectively $\varepsilon_e$, $\varepsilon_{e,n}$, $\varepsilon_{e,p}$, and $\varepsilon_{e,sep}$. Thicknesses of the positive electrode, the negative electrode, and the septate area are respectively $\delta_p$, $\delta_n$, and $\delta_{sep}$, and $t_+$ is a quantity of migrated lithium ions. An apparent mass transfer coefficient is $\alpha$, an active material equilibrium potential is $U_j^{ref}$, and a septum resistance is $R_{SEI}$. The foregoing model parameters may be obtained through measurement before modeling.

Further, status values, such as solid-phase, liquid-phase, and solid particle surface ion concentrations $C_s$, $C_e$, and $C_{s,surf}$, a local current density $j_f$, solid-phase and liquid-phase potential distributions $\varphi_s$ and $\varphi_e$, a principal reaction activation over-potential $\eta_{act}$, and an exchange current density $i_0$, and output values $V_t$ and SOC may be obtained by jointly solving partial differential equations described in the following process:

(1) Solid-Phase Lithium Ion Distribution:

$$\frac{\partial c_s(x,t,r)}{\partial t} - \frac{D_s}{r^2}\frac{\partial c_s}{\partial r}\left(r^2 \frac{\partial c_s(x,t,r)}{\partial r}\right) = 0 \quad (1)$$

where an initial value condition is as follows:

$$c_s(x,t,r) = c_{s,0}|_{t=0} \quad (2)$$

boundary conditions are as follows:

$$D_s \frac{\partial c_s(x,t,r)}{\partial r} = 0 \Big|_{r=0} \quad (3)$$

$$D_s \frac{\partial c_s(x,t,r)}{\partial r} = -\frac{j_f(x,t)}{a_s F}\Big|_{r=R_s} \quad (4)$$

(2) Liquid-Phase Lithium Ion Concentration Distribution:

$$\frac{\partial}{\partial t}\varepsilon_e c_e(x,t,r) = \frac{\partial}{\partial x}\left(D_e^{eff}\frac{\partial}{\partial x}c_e(x,t)\right) + (1-t_+)\frac{j_f(x,t)}{F} \quad (5)$$

where an initial value condition is as follows:

$$c_e(x,t)|_{t=0} = c_{s,0}$$

boundary conditions are as follows:

$$\frac{\partial}{\partial x}c_e(x,t)\Big|_{x=0} = 0, \text{ and } \frac{\partial}{\partial x}c_e(x,t)\Big|_{x=L} = 0 \quad (6)$$

$$-D_{e,n}^{eff}\frac{\partial}{\partial x}c_e\Big|_{x=\delta_n^-} = -D_{e,sep}^{eff}\frac{\partial}{\partial x}c_e\Big|_{x=\delta_n^+} \quad (7)$$

$$-D_{e,sep}^{eff}\frac{\partial}{\partial x}c_e(x,t)\Big|_{x=\delta_n+\delta_{sep}^-} = -D_{e,p}^{eff}\frac{\partial}{\partial x}c_e(x,t)\Big|_{x=\delta_n+\delta_{sep}^+} \quad (8)$$

(3) Solid-Phase Potential Distribution:

$$\frac{\partial}{\partial x}\left(\sigma^{eff}\frac{\partial}{\partial x}\phi_s(x,t)\right) - j_f(x,t) = 0 \quad (9)$$

where boundary conditions are as follows:

$$-\sigma^{eff}\frac{\partial}{\partial x}\phi_s(x,t)\Big|_{x=0} = -\sigma^{eff}\frac{\partial}{\partial x}\phi_s(x,t)\Big|_{x=L} = \frac{I(t)}{A} \quad (10)$$

$$\frac{\partial}{\partial x}\phi_s(x,t)\Big|_{x=\delta_n} = \frac{\partial}{\partial x}\phi_s(x,t)\Big|_{x=\delta_n+\delta_{sep}} = 0 \quad (11)$$

(4) Liquid-Phase Potential Distribution:

$$\frac{\partial}{\partial x}\left(\kappa^{eff}\frac{\partial}{\partial x}\phi_e(x,t)\right) + \frac{\partial}{\partial x}\left(\kappa_D^{eff}\frac{\partial}{\partial x}\ln c_e(x,t)\right) + j_f(x,t) = 0 \quad (12)$$

where a boundary condition is as follows:

$$\frac{\partial}{\partial x}\phi_e(x,t)\Big|_{x=0} = \frac{\partial}{\partial x}\phi_s(x,t)\Big|_{x=L} = 0 \quad (13)$$

(5) Two-Phase Interface Bulter-Volmer Equations:

$$j_f(x,t) = 2a_s i_0 \sinh\left(\frac{aF}{RT}\eta_{act}(x,t)\right) \quad (14)$$

$$\eta_{act}(x,t) = \phi_s(x,t) - \phi_e(x,t) - U_j^{ref}(\theta_j(x,t)) - \frac{R_{SEI,j}}{a_s}j_f(x,t), \quad (15)$$

$$j = n, p$$

$$i_0 = k(c_{s,max} - c_{s,surf})^\alpha c_{s,surf}^\alpha c_e^\alpha \quad (16)$$

$$\theta_j(x,t) = \frac{c_{s,surf}(x,t)}{c_{s,max,j}}, \quad j = n, p \quad (17)$$

$$SOC = \frac{\frac{c_{s,avg}}{c_{s,max}} - \theta_{0\%}}{\theta_{100\%} - \theta_{0\%}} \quad (18)$$

$$V(t) = \phi_s(L,t) - \phi_s(0,t) \quad (19)$$

The terminal may obtain parameter values, such as the terminal voltage V(t) and the SOC, of the virtual reference battery by jointly solving the foregoing equations (1) to (19).

Further, after obtaining the battery parameter value, such as the terminal voltage or the SOC, of the virtual reference battery, the terminal may determine, based on the battery parameter value such as the terminal voltage or the SOC, whether the target battery is micro-short-circuited. For details, refer to the implementations corresponding to the equivalent circuit model. Details are not described herein again.

In this embodiment of the present invention, the battery model, such as the equivalent circuit model and the electrochemical model, may be used as the virtual reference battery. The virtual reference battery is used to simulate the operating status of the target battery, and whether the target battery is micro-short-circuited may be further determined based on the difference between the battery parameter values of the virtual reference battery and the target battery. In this embodiment of the present invention, battery parameter values, such as the terminal voltage value and the operating current value, of the target battery may be determined based on the data collected by the BMS. Further, battery parameters, such as the remaining battery capacity of the target battery, and the terminal voltage and the remaining battery capacity of the virtual reference battery, may be calculated. Further, it may be determined, based on the difference between the terminal voltages or the remaining battery capacities of the virtual reference battery and the target battery, that the target battery is micro-short-circuited. In this embodiment of the present invention, the leakage current is detected based on the data collected by the BMS without adding an additional sensor, and an amount of data that needs to be stored and a data calculation amount are relatively small. This reduces difficulty of battery micro-short circuit detection, and applicability is high. Moreover, in this embodiment of the present invention, the micro-short circuit resistance value of the target battery may be estimated based on the leakage current value of the target battery. A micro-short circuit status of the target battery may be detected before the target battery is subject to a severe micro-short circuit. A minor micro-short circuit may be found in advance through detection, and a quantitative result is provided. This can improve accuracy of micro-short circuit detection and reduce a probability of erroneous battery fault determining, so as to achieve a prevention objective and improve battery safety.

Figure 5:
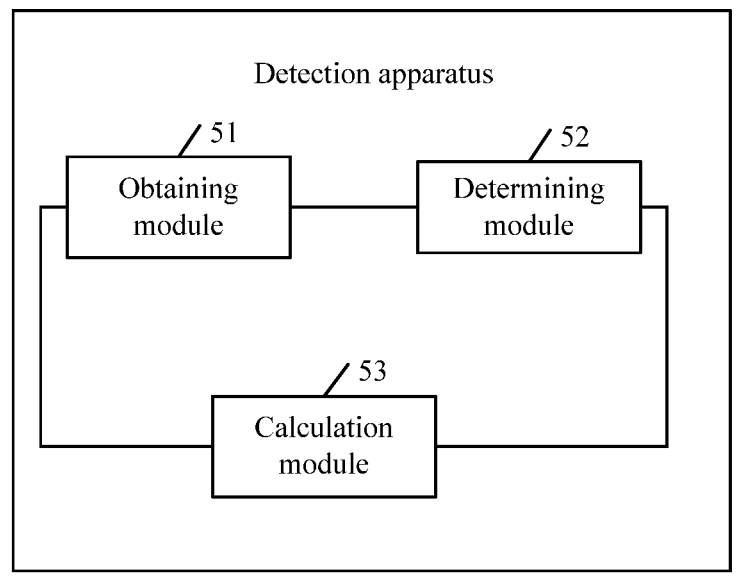
FIG. 5 is a schematic structural diagram of a battery micro-short circuit detection apparatus according to an embodiment of the present invention.

FIG. 5 is a schematic structural diagram of a battery micro-short circuit detection apparatus according to an embodiment of the present invention. The detection apparatus provided in one embodiment of the present invention includes:

an obtaining module 51, configured to: obtain a target initial battery parameter value of a target battery at an initial moment, and determine a reference initial battery parameter value of a virtual reference battery at the initial moment, where a response of the virtual reference battery is the same as a response of the target battery when a same excitation condition is given, where the obtaining module 51 is further configured to obtain a target battery parameter value of the target battery at a specified moment;

a determining module 52, configured to determine a reference battery parameter value of the virtual reference battery at the specified moment based on the target battery parameter value obtained by the obtaining module and the reference initial battery parameter; and a calculation module 53, configured to calculate a difference between the target battery parameter value obtained by the obtaining module and the reference battery parameter value determined by the determining module, where the determining module 52 is further configured to determine, based on the difference obtained by the calculation module through calculation, that the target battery is micro-short-circuited.

In one embodiment, the target battery parameter value includes a target terminal voltage value of the target battery, a current value of the target battery, and a temperature parameter value of the target battery; and the initial battery parameter value of the virtual reference battery includes an initial state-of-charge value of the virtual reference battery.

Duration between the specified moment and the initial moment is $\Delta T0$.

The determining module 52 is configured to:
determine a state-of-charge change value of the virtual reference battery within $\Delta T0$ based on the current value of the target battery and the temperature parameter value of the target battery, and determine a reference remaining battery capacity of the virtual reference battery based on the initial state-of-charge value of the virtual reference battery.

The calculation module 53 is configured to:
calculate a target remaining battery capacity of the target battery based on the target terminal voltage value, and calculate a battery capacity difference between the target remaining battery capacity and the reference remaining battery capacity.

The determining module 52 is configured to determine, based on the battery capacity difference obtained by the calculation module through calculation, that the target battery is micro-short-circuited.

In one embodiment, the specified moment includes a first moment and a second moment, and duration between the second moment and the first moment is $\Delta T1$.

The battery capacity difference includes a first battery capacity difference corresponding to the first moment, and a second battery capacity difference corresponding to the second moment.

The determining module 52 is configured to:
calculate a target difference between the second battery capacity difference and the first battery capacity difference, and determine a ratio of the target difference to $\Delta T1$ as a leakage current value of the target battery; and
if the leakage current value is greater than or equal to a preset current threshold, determine that the target battery is micro-short-circuited.

In one embodiment, the specified moment includes a first moment and a second moment, and duration between the second moment and the first moment is $\Delta T1$.

The battery capacity difference includes a first battery capacity difference corresponding to the first moment, and a second battery capacity difference corresponding to the second moment.

The calculation module 53 is configured to:
calculate a target difference between the second battery capacity difference and the first battery capacity difference, and determine a ratio of the target difference to $\Delta T1$ as a leakage current value of the target battery; and
calculate an average voltage value of the target battery within the duration, and determine a micro-short circuit resistance of the target battery with reference to the leakage current value.

The determining module 52 is configured to:
if a value of the micro-short circuit resistance obtained by the calculation module through calculation is less than a preset resistance threshold, determine that the target battery is micro-short-circuited.

In some feasible implementations, the target battery parameter value includes a target terminal voltage value of the target battery, a current value of the target battery, and a temperature parameter value of the target battery.

The initial battery parameter value of the virtual reference battery includes an initial state-of-charge value of the virtual reference battery.

Duration between the specified moment and the initial moment is $\Delta T0$.

The determining module 52 is configured to:
determine a state-of-charge change value of the virtual reference battery within $\Delta T0$ based on the current value of the target battery and the temperature parameter value of the target battery, and determine a reference remaining battery capacity of the virtual reference battery based on the initial state-of-charge value of the virtual reference battery; and
determine a reference terminal voltage value of the virtual reference battery at the specified moment based on the reference remaining battery capacity and the current value.

The calculation module 53 is configured to:
calculate a voltage difference between the target terminal voltage value and the reference terminal voltage value.

The determining module is further configured to determine, based on the voltage difference obtained by the calculation module through calculation, that the target battery is micro-short-circuited.

In one embodiment, the determining module 52 is configured to:

when the voltage difference obtained by the calculation module through calculation is greater than a preset voltage threshold, determine that the target battery is micro-short-circuited.

In some feasible implementations, the determining module 52 is configured to:

calculate a battery capacity difference between remaining battery capacities of the virtual reference battery and the target battery based on the voltage difference and the current value of the target battery; and if the battery capacity difference is greater than a preset battery capacity threshold, determine that the target battery is micro-short-circuited.

In one embodiment, the determining module 52 is configured to:

determine an element parameter of the virtual reference battery based on the reference remaining battery capacity, where the virtual reference battery includes an equivalent circuit, and the element parameter is a parameter value of an element in the equivalent circuit in a case of the temperature parameter value; and determine a terminal voltage value of the element based on the current value and the element parameter, and determine the reference terminal voltage value of the virtual reference battery based on the terminal voltage value of the element.

In one embodiment, the virtual reference battery is a battery model that is created based on an electrochemical parameter or a physical parameter of the target battery through mathematical equivalence, electrochemical modeling, or the like. The battery model includes an equivalent circuit module or an electrochemical model.

In one embodiment, the battery micro-short circuit detection apparatus may be specifically a terminal device provided in the embodiments of the present invention, and may perform, by using the modules built in the apparatus, the implementations described in the steps of the foregoing battery micro-short circuit detection method. For a specific implementation process, refer to the implementations described in the steps. Details are not described herein again.

In the embodiments of the present invention, the battery model, such as the equivalent circuit model and the electrochemical model, may be used as the virtual reference battery. The virtual reference battery is used to simulate the operating status of the target battery, and whether the target battery is micro-short-circuited may be further determined based on the difference between the battery parameter values of the virtual reference battery and the target battery. In the embodiments of the present invention, battery parameter values, such as the terminal voltage value and the operating current value, of the target battery may be determined based on the data collected by the BMS. Further, battery parameters, such as the remaining battery capacity of the target battery, and the terminal voltage and the remaining battery capacity of the virtual reference battery, may be calculated. Further, it may be determined, based on the difference between the terminal voltages or the remaining battery capacities of the virtual reference battery and the target battery, that the target battery is micro-short-circuited. In the embodiments of the present invention, the leakage current is detected based on the data collected by the BMS without adding an additional sensor, and an amount of data that needs to be stored and a data calculation amount are relatively small. This reduces difficulty of battery micro-short circuit detection, and applicability is high. Moreover, in the embodiments of the present invention, the micro-short circuit resistance value of the target battery may be estimated based on the leakage current value of the target battery. A micro-short circuit status of the target battery may be detected before the target battery is subject to a severe micro-short circuit. A minor micro-short circuit may be found in advance through detection, and a quantitative result is provided. This can improve accuracy of micro-short circuit detection and reduce a probability of erroneous battery fault determining, so as to achieve a prevention objective and improve battery safety.

In the specification, claims, and accompanying drawings of the present invention, the terms "first", "second", "third", "fourth", and the like are intended to distinguish between different objects, but do not indicate a particular order. In addition, the terms "including", "having", and any other variant thereof are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the system, the product, or the device.

A person of ordinary skill in the art may understand that all or some of the processes of the methods in the embodiments may be implemented by a computer program instructing relevant hardware. The program may be stored in a computer readable storage medium. When the program runs, the processes of the method embodiments are performed. The storage medium may be a magnetic disk, an optical disc, a read-only memory (Read-Only Memory, ROM), a random access memory (Random Access Memory, RAM), or the like.

What is disclosed above is merely examples of embodiments of the present invention, and certainly is not intended to limit the protection scope of the present invention. Therefore, equivalent variations made in accordance with the claims of the present invention shall fall within the scope of the present invention.

What is claimed is:

1. A battery micro-short circuit detection method, comprising:

obtaining a target initial battery parameter value of a target battery at an initial moment, and determining a reference initial battery parameter value of a virtual reference battery at the initial moment, wherein a response of the virtual reference battery is identical to a response of the target battery when an identical excitation condition is given, wherein the virtual reference battery includes an electrochemical model or an equivalent circuit model representative of the target battery, wherein the electrochemical model or the equivalent circuit model is updatable based on an aging parameter of the target battery to determine a different reference initial battery parameter value at the initial moment, wherein the initial moment is a moment of initialization for the virtual reference battery;

obtaining a target battery parameter value of the target battery at a specified moment, wherein the target battery parameter value comprises a target terminal voltage value of the target battery, a current value of the target battery, and a temperature parameter value of the target battery;

determining a reference battery parameter value of the virtual reference battery at the specified moment based on the target battery parameter value and the reference initial battery parameter value comprising: determining a state-of-charge change value of the virtual reference battery within a duration between the specified moment and the initial moment (ΔT0) based on the current value of the target battery and the temperature parameter value of the target battery, and determining a reference remaining battery capacity of the virtual reference battery based on an initial state-of-charge value of the reference initial battery parameter value of the virtual reference battery; and calculating a difference between the target battery parameter value and the reference battery parameter value, and determining, based on the difference, that the target battery is micro-short-circuited, wherein the specified moment comprises a first moment and a second moment, and wherein determining, based on the difference, that the target battery is micro-short-circuited further comprises:

calculating a target difference between a second battery capacity difference corresponding to the second moment and a first battery capacity difference corresponding to the first moment, and determining a ratio of the target difference to duration between the second moment and the first moment as a leakage current value of the target battery.

2. The method according to claim 1, wherein calculating a difference between the target battery parameter value and the reference battery parameter value, and determining, based on the difference, that the target battery is micro-short-circuited comprises:

calculating a target remaining battery capacity of the target battery based on the target terminal voltage value, and calculating a battery capacity difference between the target remaining battery capacity and the reference remaining battery capacity; and determining, based on the battery capacity difference, that the target battery is micro-short-circuited.

3. The method according to claim 2, wherein the battery capacity difference comprises the first battery capacity difference corresponding to the first moment and the second battery capacity difference corresponding to the second moment; and wherein determining, based on the battery capacity difference, that the target battery is micro-short-circuited comprises:

if the leakage current value is greater than or equal to a preset current threshold, determining that the target battery is micro-short-circuited.

4. The method according to claim 2, wherein the specified moment comprises a first moment and a second moment;

the battery capacity difference comprises a first battery capacity difference corresponding to the first moment and a second battery capacity difference corresponding to the second moment; and wherein determining, based on the battery capacity difference, that the target battery is micro-short-circuited comprises:

calculating a target difference between the second battery capacity difference and the first battery capacity difference, and determining a ratio of the target difference to duration between the second moment and the first moment (ΔT1) as a leakage current value of the target battery;

calculating an average voltage value of the target battery within the ΔT1, and determining a micro-short circuit resistance of the target battery with reference to the leakage current value; and if a value of the micro-short circuit resistance is less than a preset resistance threshold, determining that the target battery is micro-short-circuited.

5. The method according to claim 1, wherein the target battery parameter value comprises a target terminal voltage value of the target battery, a current value of the target battery, and a temperature parameter value of the target battery;

wherein determining a reference battery parameter value of the virtual reference battery at the specified moment based on the target battery parameter value and the reference initial battery parameter value comprises:

determining a state-of-charge change value of the virtual reference battery within duration between the specified moment and the initial moment (ΔT0) based on the current value of the target battery and the temperature parameter value of the target battery, and determining a reference remaining battery capacity of the virtual reference battery based on an initial state-of-charge value of the reference initial battery parameter value of the virtual reference battery; and determining a reference terminal voltage value of the virtual reference battery at the specified moment based on the reference remaining battery capacity and the current value; and wherein calculating a difference between the target battery parameter value and the reference battery parameter value, and determining, based on the difference, that the target battery is micro-short-circuited comprises:

calculating a voltage difference between the target terminal voltage value and the reference terminal voltage value, and determining, based on the voltage difference, that the target battery is micro-short-circuited.

6. The method according to claim 5, wherein the determining, based on the voltage difference, that the target battery is micro-short-circuited comprises:

if the voltage difference is greater than a preset voltage threshold, determining that the target battery is micro-short-circuited.

7. The method according to claim 5, wherein the determining, based on the voltage difference, that the target battery is micro-short-circuited comprises:

calculating a battery capacity difference between remaining battery capacities of the virtual reference battery and the target battery based on the voltage difference and the current value of the target battery; and if the battery capacity difference is greater than a preset battery capacity threshold, determining that the target battery is micro-short-circuited.

8. A battery micro-short circuit detection apparatus, comprising:

an obtaining module configured to: obtain a target initial battery parameter value of a target battery at an initial moment, and determine a reference initial battery parameter value of a virtual reference battery at the initial moment, wherein a response of the virtual reference battery is identical to a response of the target battery when an identical excitation condition is given, wherein the obtaining module is further configured to obtain a target battery parameter value of the target battery at a specified moment, wherein the target battery parameter value comprises a target terminal voltage value of the target battery, a current value of the target battery, and a temperature parameter value of the target battery, wherein the virtual reference battery includes an electrochemical model or an equivalent circuit model representative of the target battery, wherein the electrochemical model or the equivalent circuit model is updatable based on an aging parameter of the target battery to determine a different reference initial battery parameter value at the initial moment, wherein the initial moment is a moment of initialization for the virtual reference battery;

a determining module configured to determine a reference battery parameter value of the virtual reference battery at the specified moment based on the target battery parameter value obtained by the obtaining module and the reference initial battery parameter value including determining a state-of-charge change value of the virtual reference battery within duration between the specified moment and the initial moment ($\Delta T0$) based on the current value of the target battery and the temperature parameter value of the target battery, and determining a reference remaining battery capacity of the virtual reference battery based on an initial state-of-charge value of the reference initial battery parameter value of the virtual reference battery; and a calculation module configured to calculate a difference between the target battery parameter value obtained by the obtaining module and the reference battery parameter value determined by the determining module, wherein the determining module is further configured to determine, based on the difference obtained by the calculation module, that the target battery is micro-short-circuited, wherein the specified moment comprises a first moment and a second moment, and wherein the determining module is further configured to:

calculate a target difference between a second battery capacity difference corresponding to the second moment and a first battery capacity difference corresponding to the first moment, and determine a ratio of the target difference to duration between the second moment and the first moment as a leakage current value of the target battery.

9. The detection apparatus according to claim 8, wherein the calculation module is configured to:

calculate a target remaining battery capacity of the target battery based on the target terminal voltage value, and calculate a battery capacity difference between the target remaining battery capacity and the reference remaining battery capacity; and the determining module is configured to determine, based on the battery capacity difference obtained by the calculation module, that the target battery is micro-short-circuited.

10. The detection apparatus according to claim 9, wherein the battery capacity difference comprises the first battery capacity difference corresponding to the first moment and the second battery capacity difference corresponding to the second moment; and wherein the determining module is configured to:
if the leakage current value is greater than or equal to a preset current threshold, determine that the target battery is micro-short-circuited.

11. The detection apparatus according to claim 9, wherein the specified moment comprises a first moment and a second moment;

the battery capacity difference comprises a first battery capacity difference corresponding to the first moment and a second battery capacity difference corresponding to the second moment;

wherein the calculation module is configured to:
calculate a target difference between the second battery capacity difference and the first battery capacity difference, and determine a ratio of the target difference to duration between the second moment and the first moment ($\Delta T1$) as a leakage current value of the target battery; and calculate an average voltage value of the target battery within the duration, and determine a micro-short circuit resistance of the target battery with reference to the leakage current value; and wherein the determining module is configured to:
if a value of the micro-short circuit resistance obtained by the calculation module is less than a preset resistance threshold, determine that the target battery is micro-short-circuited.

12. The detection apparatus according to claim 8, wherein the target battery parameter value comprises a target terminal voltage value of the target battery, a current value of the target battery, and a temperature parameter value of the target battery;

wherein the determining module is configured to:
determine a state-of-charge change value of the virtual reference battery within duration between the specified moment and the initial moment ($\Delta T0$) based on the current value of the target battery and the temperature parameter value of the target battery, and determine a reference remaining battery capacity of the virtual reference battery based on an initial state-of-charge value of the reference initial battery parameter value of the virtual reference battery; and determine a reference terminal voltage value of the virtual reference battery at the specified moment based on the reference remaining battery capacity and the current value;

wherein the calculation module is configured to:
calculate a voltage difference between the target terminal voltage value and the reference terminal voltage value; and wherein the determining module is further configured to determine, based on the voltage difference obtained by the calculation module, that the target battery is micro-short-circuited.

13. The detection apparatus according to claim 12, wherein if the voltage difference obtained by the calculation module through calculation is greater than a preset voltage threshold, the target battery is micro-short-circuited.

14. The detection apparatus according to claim 12, wherein the determining module is configured to:

calculate a battery capacity difference between remaining battery capacities of the virtual reference battery and the target battery based on the voltage difference and the current value of the target battery; and if the battery capacity difference is greater than a preset battery capacity threshold, determine that the target battery is micro-short-circuited.

15. A non-transitory computer-readable storage medium comprising instructions which, when executed by a processor, cause the processor to perform operations, the operations comprising:

obtaining a target initial battery parameter value of a target battery at an initial moment, and determining a reference initial battery parameter value of a virtual reference battery at the initial moment, wherein a response of the virtual reference battery is identical to a response of the target battery when an identical excitation condition is given, wherein the virtual reference battery includes an electrochemical model or an equivalent circuit model representative of the target battery, wherein the electrochemical model or the equivalent circuit model is updatable based on an aging parameter of the target battery to determine a different reference initial battery parameter value at the initial moment, wherein the initial moment is a moment of initialization for the virtual reference battery;

obtaining a target battery parameter value of the target battery at a specified moment, wherein the target battery parameter value comprises a target terminal voltage value of the target battery, a current value of the target battery, and a temperature parameter value of the target battery;

determining a reference battery parameter value of the virtual reference battery at the specified moment based on the target battery parameter value and the reference initial battery parameter value comprising: determining a state-of-charge change value of the virtual reference battery within a duration between the specified moment and the initial moment ($\Delta T0$) based on the current value of the target battery and the temperature parameter value of the target battery, and determining a reference remaining battery capacity of the virtual reference battery based on an initial state-of-charge value of the reference initial battery parameter value of the virtual reference battery; and calculating a difference between the target battery parameter value and the reference battery parameter value, and determining, based on the difference, that the target battery is micro-short-circuited, wherein the specified moment comprises a first moment and a second moment, and wherein determining, based on the difference, that the target battery is micro-short-circuited further comprises:

calculating a target difference between a second battery capacity difference corresponding to the second moment and a first battery capacity difference corresponding to the first moment, and determining a ratio of the target difference to duration between the second moment and the first moment as a leakage current value of the target battery.

16. The computer-readable storage medium according to claim 15, wherein calculating a difference between the target battery parameter value and the reference battery parameter value, and determining, based on the difference, that the target battery is micro-short-circuited comprises:

calculating a target remaining battery capacity of the target battery based on the target terminal voltage value, and calculating a battery capacity difference between the target remaining battery capacity and the reference remaining battery capacity; and determining, based on the battery capacity difference, that the target battery is micro-short-circuited.

17. The computer-readable storage medium according to claim 16, wherein the battery capacity difference comprises the first battery capacity difference corresponding to the first moment and the second battery capacity difference corresponding to the second moment; and wherein determining, based on the battery capacity difference, that the target battery is micro-short-circuited comprises:

if the leakage current value is greater than or equal to a preset current threshold, determining that the target battery is micro-short-circuited.

18. The computer-readable storage medium according to claim 16, wherein the specified moment comprises a first moment and a second moment;

the battery capacity difference comprises a first battery capacity difference corresponding to the first moment and a second battery capacity difference corresponding to the second moment; and wherein determining, based on the battery capacity difference, that the target battery is micro-short-circuited comprises:

calculating a target difference between the second battery capacity difference and the first battery capacity difference, and determining a ratio of the target difference to duration between the second moment and the first moment ($\Delta T1$) as a leakage current value of the target battery;

calculating an average voltage value of the target battery within the $\Delta T1$, and determining a micro-short circuit resistance of the target battery with reference to the leakage current value; and if a value of the micro-short circuit resistance is less than a preset resistance threshold, determining that the target battery is micro-short-circuited.

19. The computer-readable storage medium according to claim 15, wherein the target battery parameter value comprises a target terminal voltage value of the target battery, a current value of the target battery, and a temperature parameter value of the target battery;

wherein determining a reference battery parameter value of the virtual reference battery at the specified moment based on the target battery parameter value and the reference initial battery parameter value comprises:

determining a state-of-charge change value of the virtual reference battery within duration between the specified moment and the initial moment ($\Delta T0$) based on the current value of the target battery and the temperature parameter value of the target battery, and determining a reference remaining battery capacity of the virtual reference battery based on an initial state-of-charge value of the reference initial battery parameter value of the virtual reference battery; and determining a reference terminal voltage value of the virtual reference battery at the specified moment based on the reference remaining battery capacity and the current value; and wherein calculating a difference between the target battery parameter value and the reference battery parameter value, and determining, based on the difference, that the target battery is micro-short-circuited comprises:

calculating a voltage difference between the target terminal voltage value and the reference terminal voltage value, and determining, based on the voltage difference, that the target battery is micro-short-circuited.

20. The computer-readable storage medium according to claim 19, wherein the determining, based on the voltage difference, that the target battery is micro-short-circuited comprises:

if the voltage difference is greater than a preset voltage threshold, determining that the target battery is micro-short-circuited.

\* \* \* \* \*